(12) United States Patent
Wang et al.

(10) Patent No.: US 6,903,379 B2
(45) Date of Patent: Jun. 7, 2005

(54) GAN BASED LED LIGHTING EXTRACTION EFFICIENCY USING DIGITAL DIFFRACTIVE PHASE GRATING

(75) Inventors: Michael Wang, Duluth, GA (US); Hari Venugopalan, Somerset, NJ (US)

(73) Assignee: GELcore LLC, Valley View, OH (US)

( * ) Notice: Subject to any disclaimer, the term of this patent is extended or adjusted under 35 U.S.C. 154(b) by 0 days.

(21) Appl. No.: 10/291,981

(22) Filed: Nov. 12, 2002

(65) Prior Publication Data

US 2003/0213969 A1 Nov. 20, 2003

Related U.S. Application Data

(60) Provisional application No. 60/332,288, filed on Nov. 16, 2001.

(51) Int. Cl.[7] ............................................... H01L 33/00
(52) U.S. Cl. ........................... 257/98; 257/94; 257/96; 257/97; 257/103; 372/45; 372/46
(58) Field of Search ........................... 257/94–99, 103; 372/45–46

(56) References Cited

U.S. PATENT DOCUMENTS

| | | | |
|---|---|---|---|
| 3,883,772 A | 5/1975 | Wako et al. | |
| 4,789,881 A | 12/1988 | Alphonse | |
| 4,894,835 A | 1/1990 | Uomi et al. | |
| 4,952,019 A | 8/1990 | Evans et al. | |
| 5,237,581 A | 8/1993 | Asada et al. | |
| 5,296,724 A | 3/1994 | Ogata et al. | |
| 5,324,964 A | 6/1994 | Ackley et al. | |
| 5,379,318 A | 1/1995 | Weber | |
| 5,406,095 A | 4/1995 | Koyama et al. | |
| 5,434,434 A | 7/1995 | Kasahara et al. | |
| 5,475,237 A | 12/1995 | Narui et al. | |
| 5,485,014 A | 1/1996 | Jain et al. | |
| 5,491,350 A | 2/1996 | Unno et al. | |
| 5,497,393 A | 3/1996 | Lee | |
| 5,536,974 A | 7/1996 | Nishiguchi | |
| 5,537,433 A | 7/1996 | Watanabe | |
| 5,553,091 A | 9/1996 | Delorme | |
| 5,561,683 A | 10/1996 | Kwon | |
| 5,568,499 A | 10/1996 | Lear | |
| 5,581,572 A | 12/1996 | Delorme et al. | |
| 5,659,562 A | 8/1997 | Hisa | |
| 5,705,834 A | 1/1998 | Egalon et al. | |
| 5,727,016 A | 3/1998 | Paxton | |
| 5,748,660 A | 5/1998 | Delorme et al. | |
| 5,779,924 A | * 7/1998 | Krames et al. | ............... 216/24 |
| 5,793,062 A | 8/1998 | Kish, Jr. et al. | |
| 5,809,050 A | 9/1998 | Baldwin et al. | |
| 5,814,839 A | 9/1998 | Hosoba | |
| 5,817,537 A | 10/1998 | Bodere et al. | |
| 5,844,257 A | 12/1998 | Chen | |
| 5,852,625 A | 12/1998 | Takahashi | |
| 5,867,521 A | 2/1999 | Macomber | |
| 5,886,370 A | 3/1999 | Sun et al. | |

(Continued)

FOREIGN PATENT DOCUMENTS

| | | |
|---|---|---|
| CN | 253999 | 8/1995 |
| EP | 0 361 602 A2 | 4/1990 |
| JP | 2000-56968 | 2/2002 |

OTHER PUBLICATIONS

Article "Phase Masks and Grey–Tone Masks", Pierre Sixt, Litomask by CSEM, Neuchatel, Switzerland.

*Primary Examiner*—Donghee Kang
(74) *Attorney, Agent, or Firm*—Fay, Sharpe, Fagan, Minnich & McKee, LLP

(57) ABSTRACT

A light emitting diode incorporating an active emitting layer (14) overlying a transparent substrate (10) is provided with a reflective diffraction grating (30) on the bottom surface of the substrate. Emitted light passing downwardly through the substrate is diffracted outwardly toward edges (21) of the substrate and passes out of the die through the edges. This effect enhances the external quantum efficiency of the diode.

18 Claims, 3 Drawing Sheets

U.S. PATENT DOCUMENTS

| | | |
|---|---|---|
| 5,907,160 A | 5/1999 | Wilson et al. |
| 5,917,201 A | 6/1999 | Ming-Jiunn et al. |
| 5,917,202 A | 6/1999 | Haitz et al. |
| 5,926,493 A | 7/1999 | O'Brien et al. |
| 5,926,497 A | 7/1999 | Nitta et al. |
| 5,953,361 A | 9/1999 | Borchert et al. |
| 5,970,081 A | 10/1999 | Hirayama et al. |
| 5,973,336 A | 10/1999 | Hanke et al. |
| 6,014,400 A | 1/2000 | Kobayashi |
| 6,018,534 A | 1/2000 | Pan et al. |
| 6,023,354 A | 2/2000 | Goldstein et al. |
| 6,031,243 A | 2/2000 | Taylor |
| 6,057,562 A | 5/2000 | Lee et al. |
| 6,075,908 A | 6/2000 | Paniccia et al. |
| 6,088,377 A | 7/2000 | Matsuda |
| 6,130,445 A | 10/2000 | Wang et al. |
| 6,133,589 A | 10/2000 | Krames et al. |
| 6,160,273 A | 12/2000 | Fork et al. |
| 6,476,550 B1 | 11/2002 | Oda et al. |
| 2003/0010991 A1 * | 1/2003 | Shen et al. .................. 257/98 |

* cited by examiner

GAN BASED LED LIGHTING EXTRACTION EFFICIENCY USING DIGITAL DIFFRACTIVE PHASE GRATING

CROSS-REFERENCE TO RELATED APPLICATIONS

The present application claims benefit of U.S. Provisional Patent Application Ser. No. 60/332,288, filed Nov. 16, 2001, the disclosure of which is hereby incorporated by reference herein.

FIELD OF THE INVENTION

The present invention relates to light emitting diodes having enhanced light extraction efficiency.

BACKGROUND OF THE INVENTION

Light emitting diodes or "LEDs" are semiconductor devices which are used as light emitting elements in indicators, displays and instruments. Increasingly, LED's are being used as replacements for ordinary light bulbs as, for example, in automobile brake lights and traffic lights. LED's provide numerous advantages including compactness and efficient conversion of electrical energy to light.

Conventional LED's include thin layers of semiconductor material of two opposite conductivity types disposed in a stack, one above the other, with one or more layers of n-type material in one part of the stack and one or more layers of p-type material at another part of the stack. The LED includes a junction at the interface of the p-type and n-type layers. The various layers of the stack may be deposited in sequence on a substrate, such as a sapphire substrate, to form a wafer. The wafer is then cut apart to form individual dies which constitute separate LEDs. The substrate constitutes the bottom or rear of the stack. The n-type and p-type layers typically are quite thin, as, for example, a few tenths of a micron to a few microns thick, whereas the substrate typically is thick enough to survive handling during manufacture as, for example, a few tenths of a millimeter thick. Appropriate electrodes are provided for applying an electrical current through the p-type and n-type layers of the stack, so that the current passes through the junction. Each such electrode typically includes a pad suitable for attachment of wires or leads. Typically, one electrode is disposed on the top or front surface of the stack, remote from the substrate, whereas another electrode is disposed on the substrate or on a layer close to the substrate, so that the electrodes are disposed on opposite sides of the junction. The electrode disposed on the top of the stack may include a transparent conductive layer to enhance distribution of the current over the horizontal extent of the stack.

The stack structure typically is mounted in a package which supports and protects the structure during use. For example, the rear surface of the substrate may be mounted to a metal reflector by an epoxy or other adhesive, commonly referred to as a "die bond". A transparent encapsulant may be provided over the stack and reflector.

In operation, electric current passing between the electrodes and through the LED is carried principally by electrons in the n-type layer and by electron vacancies or "holes" in the p-type layer. The electrons and holes move in opposite directions toward the junction, and recombine with one another at the junction. Energy released by electron-hole recombination is emitted from the LED as light. As used in the present disclosure, the term "light" includes visible light rays, as well as light rays in the infrared and ultraviolet wavelength ranges. The wavelength of the emitted light depends on many factors, including the composition of the semiconductor materials and the structure of the junction.

The term "external quantum efficiency" as used with reference to an LED refers to the ratio between the amount of energy emitted to the outside of the stack or to the outside of the package and the amount of energy supplied by the electrical current passing through the device. Of course, it is desirable to maximize the external quantum efficiency of an LED. Not all of the light which is emitted at the junction reaches the outside of the stack or the outside of the package. The term "extraction efficiency" refers to the ratio between the amount of light emitted at the junction and the amount of light which reaches the outside of the stack or package. All else being equal, increasing the extraction efficiency directly increases the external quantum efficiency.

The light emitted at the junction normally is emitted in all directions from each point within the junction. Light passing vertically upwardly from the junction escapes from the stack through the top of the stack. However, the bonding pad of the top electrode typically is opaque, and blocks some of the light which passes upwardly, toward the top of the stack. Moreover, where a transparent electrode is employed, the transparent electrode does not have perfect transparency, and hence absorbs some of the light passing upwardly. Light passing upwardly from the junction at a shallow oblique angle, close to the horizontal direction, can be reflected at the top surface and redirected downwardly into the stack and toward the edges of the stack. Some of the light passes out of the stack at the edges. Also, about one-half of the light emitted at the junction is initially directed downwardly toward the substrate. Where the substrate is opaque, this light is absorbed in the substrate. Where the substrate is transparent, but the bottom surface of the substrate is mounted using an opaque die bond, this light is absorbed in the die bond. This last effect promotes degradation of the die bond during service, as well as reducing the external quantum efficiency of the device.

Various proposals to attack this problem have been advanced heretofore. Some of these proposals would require unconventional structures for mounting the stack structure in the package, which in turn would increase the cost. As disclosed, for example, in U.S. Pat. No. 5,939,735, it has been proposed to provide an LED having a transparent substrate with a reflective coating on the bottom or rear surface of the substrate. The reflective coating redirects light reaching the bottom of the stack upwardly through the stack. While such a reflective coating can increase the external quantum efficiency of the device somewhat, its effect is limited by the blocking effect of the top electrode pad and by absorption in the transparent layer at the top of the stack. Moreover, light reflected upwardly from the bottom of the substrate must pass through the junction. The junction typically has very high absorptivity for light at the emission wavelength. Thus, a considerable part of the light reflected from the bottom of the stack is absorbed and converted to useless heat in the junction, before it ever reaches the top of the stack.

Accordingly, despite all of the efforts which have been devoted in the art heretofore to increasing the extraction efficiency of LED's, still further improvements would be desirable.

SUMMARY OF THE INVENTION

One aspect of the invention provides a light emitting diode including a stacked structure having a top surface, a bottom surface, and edges extending between the top and bottom surfaces. The stacked structure also includes an emitting junction extending generally in a horizontal plane above the bottom surface. The emitting junction has an emission wavelength, such that when energized by an electrical current passing through the stacked structure, light will be emitted at the junction and the light will be predominantly within a band of wavelengths centered on the emission wavelength. The stacked structure has vertical directions normal to the emitting junction, i.e., upwardly and downwardly within the stack.

Most preferably, the LED in accordance with this aspect of the invention includes a reflective diffraction grating disposed on or in the stacked structure below the junction. Preferably, the stacked structure includes a transparent substrate, and the reflective diffraction grating is disposed at the bottom surface of the substrate. The grating is operative to diffract light at the emission wavelength directed vertically downwardly from said emission layer so that a substantial portion of such light is diffracted upwardly into the structure in major diffraction directions oblique to the vertical and toward the edges of the structure. Thus, a significant portion of the light directed vertically downwardly into the grating is directed upwardly at an oblique angle to the vertical and hence passes out through the edges of the stack below the junction. Because this redirected light does not have to pass through the junction, it will not be absorbed in the junction. Most preferably, the major diffraction directions intercept the edges of the stacked structure at angles to the normal of the edge surface less than the critical angle for internal reflection, so that the redirected light can pass out through the edges of the stack.

Most preferably, the diffraction grating is a binary phase grating, i.e., a grating having alternating first and second regions, these regions being arranged to impart one phase shift to light reflected in the first regions and another, different phase shift to light reflected in the second regions. Most desirably, the phase shifts imparted by the first and second regions differ from one another by $\pi$ radians. In such a grating, the major diffraction directions will be the first order diffraction directions, i.e., the directions of the +1 and −1 order diffracted light. Such a grating will reflect essentially none of the incoming vertically-directed light directly upwardly, and will direct about 80% of the incoming vertically-directed light along the +1 and −1 diffraction directions. As further discussed below, the angle to the vertical of these diffraction directions is determined by the relationship between the repeat distance of the grating and the emission wavelength.

DETAILED DESCRIPTION OF THE PREFERRED EMBODIMENTS

Figure 1:
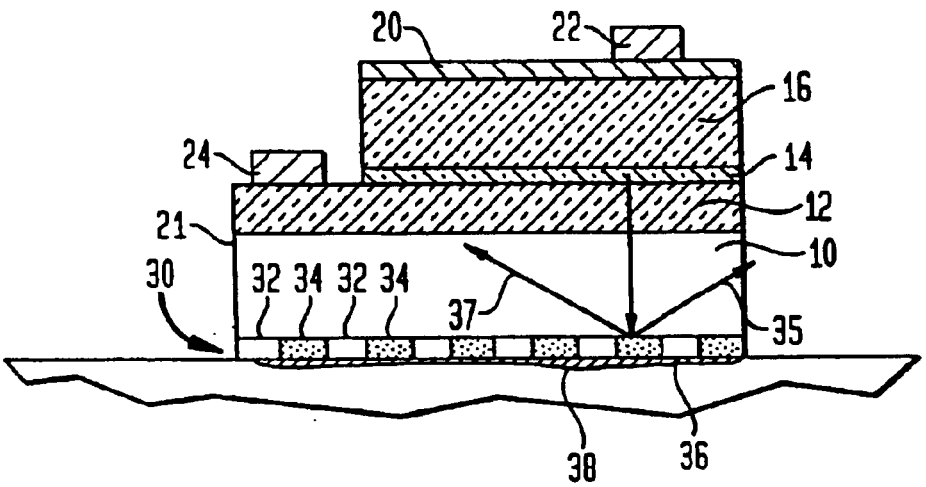
FIG. 1 is a diagrammatic sectional elevational view of a light emitting diode in accordance with one embodiment of the invention.

An LED in accordance with one embodiment of the invention includes a stacked structure of semiconductor layers incorporating a substrate 10. The stacked structure includes n-type nitride semiconductor material in a bottom region 12 adjacent the substrate, p-type nitride semiconductor material in an upper region 16 and a junction 14 between these regions.

Each of regions 12 and 16 can include any number of layers. Merely by way of example, the lower region may incorporate a buffer layer at the interface with substrate 10, whereas the upper region may incorporate a highly doped contact layer defining the top surface of this region to aid in establishing ohmic contact with a top electrode discussed below. Regions 12 and 16 typically are transparent to light at the wavelength which will be emitted by the LED in service. That is, the top region is formed entirely or principally from materials having a band gap greater than the energy of the photons which will be emitted at junction 14. The structure and composition of the various layers incorporated in the stack and the sequence of layers in the stack may be selected according to known principles and techniques to provide the desired emission characteristics.

Merely by way of example, lower region 12 and upper region 14 may be formed from one or more III–V semiconductors such as nitride-based semiconductors, i.e., a III–V semiconductor in which nitrogen constitutes 50 mole percent or more, most typically 80 mole percent or more of the Group V component, and may be formed from a pure nitride semiconductor, wherein the Group V component consists essentially of nitrogen. For example, these layers may be formed from one or more gallium nitride based semiconductors, i.e., nitride based semiconductors including gallium such as GaN, InGaN, AlInGaN or AlGaN.

The p-type and n-type conductivity of the various layers may be imparted by conventional dopants and may also result from the inherent conductivity type of the particular semiconductor material. For example, gallium nitride based semiconductors typically are inherently n-type even when undoped. N-type nitride semiconductors may include conventional electron donor dopants such as Si, Ge, S, and O, whereas p-type nitride semiconductors may include conventional electron acceptor dopants such as Mg and Zn.

The junction 14 between the n-type lower region and the p-type upper region is symbolized in FIG. 1 as a discrete layer interposed between regions 12 and 16. In practice, the regions 12 and 16 may abut one another so that they define the junction at their mutual border. Alternatively, the junction 14 may include additional layers in the mutually adjacent portions of regions 12 and 16 or between these regions. Thus, the junction may be a simple homojunction; a single heterojunction, a double heterojunction, a single quantum well, a multiple quantum well or any other type of junction structure.

Substrate 10 is also transparent to light at the emission wavelength of junction 14. Where the lower region 12 is formed from a nitride-based semiconductor, substrate 10 most preferably is formed from sapphire or silicon carbide. The stacked structure has edges 21 extending between the top of the structure (at the top of upper region 18) and the bottom of the structure (the bottom of substrate 10).

The fabrication processes used to form the stacked structure are also well known. The various layers constituting the regions of the stack structure above the substrate typically are grown on the substrate while the substrate is part of a larger wafer, and the various layers cover the entire wafer. The wafer is later subdivided to form individual pieces or "dies". Most commonly, the various layers which form the stacked structure are deposited on the substrate in sequence by techniques such as metal organic chemical vapor deposition ("MOCVD") molecular beam epitaxy and the like.

Figure 2:
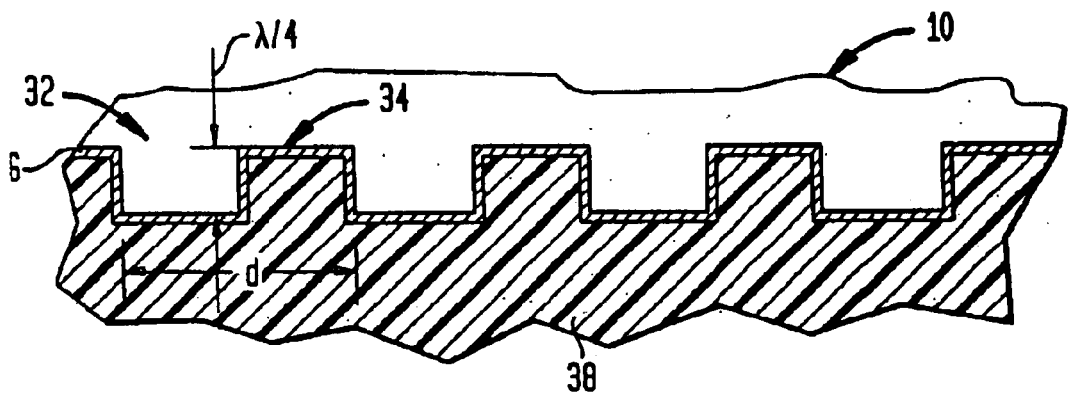
FIG. 2 is a fragmentary, diagrammatic sectional view on an enlarged scale, depicting a portion of the diode shown in FIG. 1.

Substrate 10 has a diffraction grating 30 on its bottom surface. The diffraction grating includes a series of first regions 32 (schematically shown as unshaded bands in FIG. 1) and second regions 34 (schematically shown as shaded bands in FIG. 1). As best seen in FIG. 2, the first regions 32 and second regions 34 are actually formed as regions of substrate 10 having different vertical elevations, such that each first region 32 projects below the adjacent second region by a predetermined distance. This difference is equal to $\lambda/4$, where $\lambda$ is equal to the wavelength of light emitted from junction 14 propagating through the material of the substrate. The first and second regions are provided as a regular repeating pattern having a period or horizontal repeat distance d. A reflective material such as an aluminum or other metal layer 36 is provided on the surfaces of regions 32 and 34. For example, the first and second regions 32 and 34 may be defined by etching the substrate using conventional masking and etching techniques, and the reflective layer can be formed by depositing a metal such as aluminum using techniques such as vacuum evaporation or sputtering. The metal layer may include more than one metal. For example, to provide a solderable surface on the bottom of the substrate, aluminum, titanium, platinum and gold may be deposited in that order on regions 32 and 34.

Figure 3:
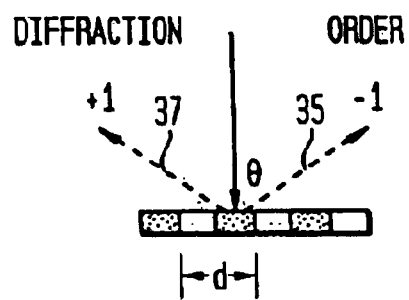
FIG. 3 is a diagrammatic view depicting certain directional relationships in the diode of FIGS. 1 and 2.

Thus, light passing vertically downwardly to diffraction grating 14 will be reflected at the surfaces of regions 32 and 34. However, the light reflected from first regions 32 will traverse a path $\lambda/2$ (one half wavelength) longer than the light reflected from second regions 34, and accordingly the light reflected from regions 32 will be phase shifted by $\pi$ radians with respect to the light reflected from regions 34. Stated another way, the diffraction grating is a reflective binary phase grating having a phase difference of $\pi$. Such a grating will direct light directed vertically downwardly, normal to the plane of the grating, in a diffraction pattern which includes positive and negative first order diffraction directions +1 and −1, schematically illustrated by arrows 35 and 37 in FIG. 3. For the such a grating, the efficiency $\eta$ or ratio of optical power along a particular diffraction direction to incident optical power is given by:

$$\eta = 4/(n\pi)^2, \quad (1)$$

where n is the diffraction order. For the first order (n=+1), $\eta$ is about 0.4, or 40%, so that about 40% of the incident optical power is directed along the +1 diffraction direction. The efficiency is the same for the −1 direction, and hence about 80% of the incident optical power is reflected in the +1 and −1 directions taken together. Notably, the efficiency $\eta$ is zero for the zero-order direction normal to the plane of the grating, so that essentially none of the incident optical power is reflected vertically upwardly, normal to the plane of the grating.

The angle $\theta$ between the +1 direction and the vertical is given by:

$$\sin \theta = \lambda/d \quad (2)$$

where d is the repeat period of the grating. The −1 direction lies at an equal but opposite angle to the vertical.

The stacked structure has a conventional n-electrode including a pad 24 in contact with the lower, n-type region 12 and has a conventional p-electrode including a pad 22 and a transparent conductive layer 20 in contact with the upper, p-type region 16. The pads are connected by bonding wires or other leads (not shown) to a source of electrical power. The stacked structure may be mounted in a conventional mounting using a die bond 38 (FIG. 1) abutting the bottom of the diffraction grating, i.e., the surface of reflective layer 36 remote from substrate 10. The mounting may include features such as a reflector surrounding the stacked structure for directing the emitted light, and a heat sink which may be integral with the reflector. Also, an encapsulant (not shown) may surround the stacked structure so that light emitted from the stacked structure passes through the encapsulant. The encapsulant may include one or more phosphors for converting some or all of the emitted light to light at one or more different wavelengths.

In operation, electrical current passing through the stacked structure between the electrodes causes emission of light within junction 14. Some of the light passes upwardly from the junction and is emitted through the top surface of the stacked structure, i.e., through the transparent electrode 20. The light passing vertically downwardly from the junction layer is redirected principally along the major diffraction directions 35 and 37, and hence is redirected toward the edges 21 of the stacked structure. A significant portion of the redirected light reaches the edges directly, without further reflection, and passes out through the edges. Light which initially passes downwardly from the stacked structure at an angle oblique to the vertical direction will be redirected in a similar pattern, but with the +1 and −1 directions tilted by an angle equal to the angle between the oblique direction of incidence and the vertical. Thus, a significant portion, and desirably most or all of the light which passes downwardly from the junction passes out of the stacked structure through the edges without passing upwardly through the junction 14 and without passing through the top of the stack.

Figure 4:
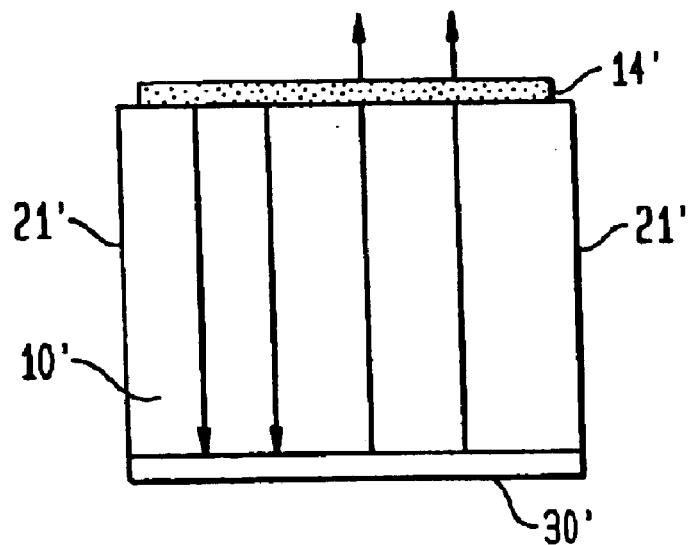
FIG. 4 is a view similar to FIG. 1 but depicting a conventional light emitting diode.
Figure 5:
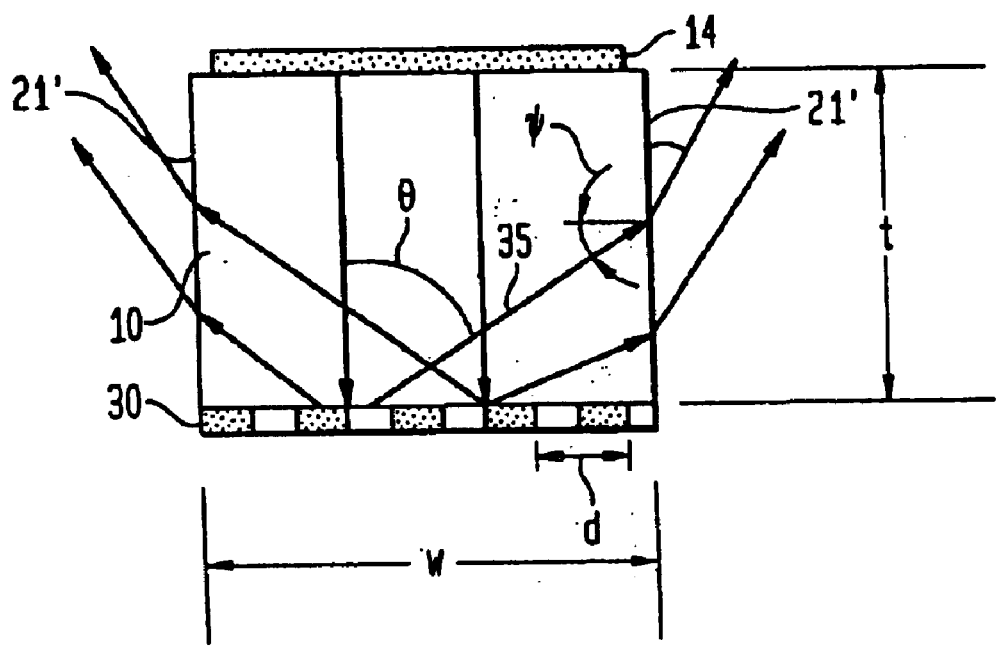
FIG. 5 is a diagrammatic view depicting light paths in the light emitting diode of FIG. 1.
Figure 6:
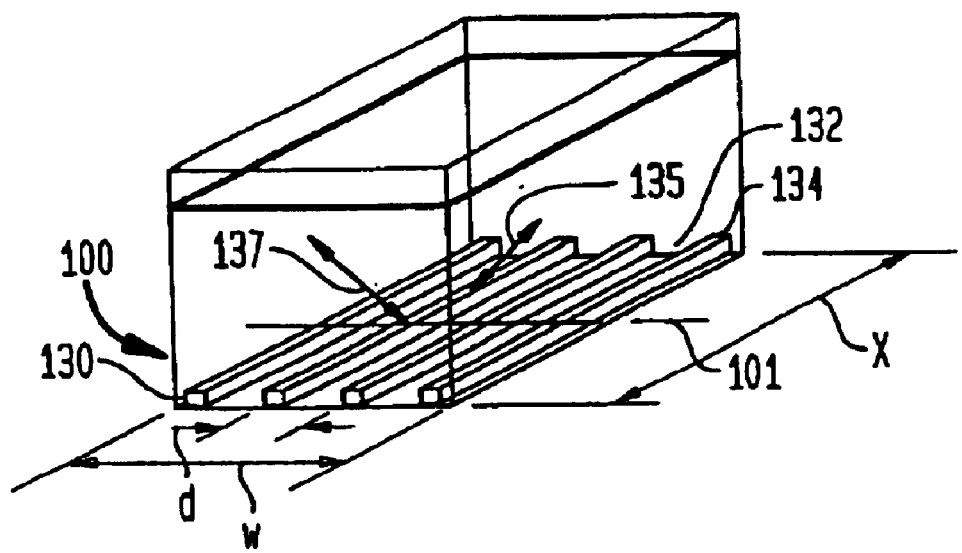
FIG. 6 is a diagrammatic perspective view depicting a light emitting diode in accordance with a further embodiment of the invention.

The overall effect is shown schematically in FIG. 5. For comparison, a similar structure shown schematically in FIG. 4, has a conventional reflective coating 30' on the bottom surface of the substrate 10'. Light directed downwardly is reflected upwardly through the junction layer 14', where a significant portion is absorbed. As also seen in FIG. 5, the amount of light passing directly out through the edges of the stacked structure below the junction is related to the thickness t of the structure beneath the junction. Because the lower region 16 (FIG. 1) is typically much thinner than the substrate, the thickness t beneath the junction can be taken as equal to the thickness of the substrate. All of the light passing along the major diffraction directions 35 and 37 will pass directly to the edges of the substrate if $$t > w/\tan \theta \quad (3)$$

where w is the horizontal dimension of the stack structure in the direction corresponding to the projection of the major diffraction direction in the horizontal plane, i.e., in the horizontal direction of the repeat dimension d of the grating. For example, as seen in FIG. 6, a stack structure 100 may have a grating 130 consisting of first and second regions in the form of elongated strips 132, 134 with a repeat direction d transverse to the direction of elongation of the strips. The principal diffraction directions are disposed in a vertical plane perpendicular to the lengthwise directions of the strips, which cuts the bottom surface along an axis 101 extending in the repeat direction. The relevant dimension w of the stack is the dimension along axis 101; the other horizontal dimension x of the stack structure is irrelevant in this case. Dimension w can be smaller than dimension x, so as to provide a stack structure elongated in the direction of elongation of the strips.

Figure 7:
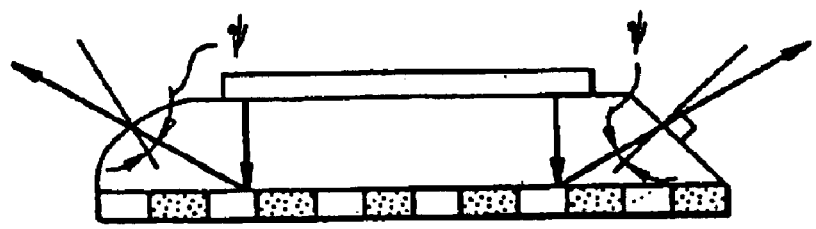
FIG. 7 is a diagrammatic sectional view depicting a light emitting diode in accordance with yet another embodiment of the invention.

To allow the light which impinges on the edges to escape, the angle ψ between each major diffraction direction and the normal to the edge surface should be less than the critical angle for total internal reflection at the edge surface. The critical angle is determined in the conventional manner on the basis of Snell's law. The critical angle depends upon the indices of refraction of the substrate and the surrounding materials. Typically, the index of refraction of the substrate is substantially higher than the index of refraction of the surrounding encapsulant or air. The greater the difference in index of refraction, the smaller the critical angle. To assure that the angles ψ between the major diffraction directions and the edge surfaces are less than the critical angle, the edge surfaces may be inclined to the vertical direction. Thus, as seen schematically in FIG. 7, the edge surfaces may be planar surfaces inclined to the vertical as shown at 201, or may be curved surfaces 202. Such inclined edge surfaces can be formed, for example, by the techniques disclosed in copending, commonly assigned U.S. Provisional Patent Application Ser. No. 60/249,657, filed Nov. 17, 2000, the disclosure of which is hereby incorporated by reference herein and a copy of which is annexed hereto.

Numerous variations and combinations of the features described above can be employed. For example, the invention can be applied to LED's formed from essentially any semiconductor materials, and is not limited to use with the III–V materials such as gallium nitride based materials. The conductivity types can be reversed from the arrangement shown, so that the lower region is p-type whereas the upper region is n-type. Also, the grating need not have the same pattern over the entire bottom surface of the substrate. In a further variant, the substrate may include a lower layer bearing the diffraction grating and an upper layer used as a growth substrate for formation of the semiconductors. The lower layer can be formed separately from the upper layer, and can be assembled with the upper layer after growth of the semiconductors.

The following claims further describe certain features of the invention.

As these and other variations and combinations of the features set forth above can be utilized, the foregoing description of the preferred embodiments should be taken by way of illustration rather than by limitation of the invention.

What is claimed is:

1. A light emitting diode comprising:
    (a) a stacked structure having a top surface, a bottom surface, edges extending between said top and bottom surfaces and an emitting junction extending generally in a horizontal plane above the bottom surface, said emitting junction having an emission wavelength; said stacked structure having vertical directions normal to the emitting junction, and
    (b) a reflective periodic diffraction grating disposed below said emitting junction on or in said stacked structure, said grating including a plurality of elements periodically spaced apart from one another in a repeat direction defining a set of first regions and second regions having different vertical elevations, such that said first regions project below said second regions by a predetermined distance, said first and second regions arranged to reflect light at phases differing by π, the periodic spacing of the first and second regions of said grating being operative to diffract light at said emission wavelength directed vertically downwardly from said emission layer so that a substantial portion of such light is reflectively diffracted in major diffraction directions oblique to the vertical and intersecting the edges of the structure.

2. A light emitting diode as claimed in claim 1 wherein said structure includes a substrate disposed between said junction and said grating, said substrate being transparent to light at said emission wavelength, said substrate defining portions of said edges.

3. A light emitting diode as claimed in claim 2 wherein said grating is arranged so that at least some of the upwardly-diffracted light passes through portions of said edges defined by said substrate.

4. A light emitting diode as claimed in claim 3 wherein said substrate has a thickness t in the vertical direction such that:

$$t > w/\tan \theta$$

where:
    w is the horizontal dimension of the substrate in the repeat direction of the grating; and
    θ is the angle between one said major diffraction direction and the vertical.

5. A light emitting diode as claimed in claim 2 wherein said grating is disposed at the bottom of said substrate.

6. A light emitting diode as claimed in claim 2 wherein said stack structure includes one or more nitride-based semiconductors defining said emitting junction.

7. A light emitting diode as claimed in claim 6 wherein said substrate consists essentially of sapphire.

8. A light emitting diode as claimed in claim 1 wherein said grating is in the form of a plurality of elongated strips extending substantially parallel to one another, each said strip extending in a lengthwise direction perpendicular to said repeat direction, and wherein said stack structure has a dimension x in the lengthwise direction greater than a dimension w in the repeat direction.

9. A light emitting diode as claimed in claim 1 wherein said stacked structure has a critical angle for total internal reflection at said edges of said stacked structure, and said major diffraction directions intercept the edges of the stacked structure at angles to the normal of the edge surface less than said critical angle.

10. The light emitting diode according to claim 9, wherein the said edges are curved.

11. The light emitting diode according to claim 1, wherein said predetermined distance is equal to λ/4, where λ is equal to said emission wavelength.

12. The light emitting diode according to claim 11, wherein light reflected from said first regions traverse a path of λ/2 longer than light reflected from said second regions, where λ is equal to said emission wavelength.

13. A light emitting diode comprising:
    a light emissive stacked structure including:
        (i) a substrate having top and bottom principal surfaces transverse to a vertical direction, and
        (ii) a light emissive stack disposed on the top principal surface of the substrate,
    the light emissive stacked structure having light transmitting edges spaced apart by a horizontal dimension in a horizontal direction transverse to the vertical direction; and
    a reflective periodic diffraction grating disposed on or in the bottom principal surface of the substrate and having a grating period in the horizontal direction defining selected non-zeroeth order diffraction directions, the horizontal dimension, a thickness of the light emissive stacked structure, and the grating period being selected such that a substantial portion of vertically oriented light diffracted by the diffraction grating into the selected non-zeroeth order diffraction directions exits the light emissive stacked structure via the light transmitting edges, the reflective periodic diffraction grating including:

first regions and second regions alternating along the horizontal direction to define the grating period, the first and second regions having different vertical elevations, such that the first regions project below the second regions by a predetermined distance selected so that the first and second regions reflect light at phases differing by $\pi$.

14. The light emitting diode as set forth in claim 13, wherein at least about 80% of vertically oriented light emitted by the light emissive stack into the substrate is diffracted into the selected non-zeroeth order diffraction directions.

15. The light emitting diode as set forth in claim 13, wherein substantially no portion of the vertically oriented light emitted by the light emissive stack into the substrate is diffracted into a zeroeth order diffraction direction oriented vertically away from the bottom principal surface of the substrate.

16. The light emitting diode as set forth in claim 13, wherein the selected non-zeroeth order diffraction directions are selected from a group consisting of positive and negative first order diffraction directions.

17. The light emitting diode as set forth in claim 13, wherein the reflective periodic diffraction grating is a binary phase grating having the grating period along the horizontal direction.

18. The light emitting diode as set forth in claim 13, wherein edge surfaces of the light transmitting edges are inclined such that an angle between each selected non-zeroeth order diffraction direction and an edge surface it intersects is less than a critical angle for total internal reflection.

* * * * *